US007119460B2

(12) United States Patent
(10) Patent No.: US 7,119,460 B2
(45) Date of Patent: Oct. 10, 2006

Poldervaart et al.

(54) FLOATING POWER GENERATION SYSTEM

(75) Inventors: Leendert Poldervaart, Monaco (MC); Bram Van Cann, Nice (FR); Hein Wille, Eze (FR); Leon D. Rosen, Los Angeles, CA (US)

(73) Assignee: Single Buoy Moorings, Inc., Houston, TX (US)

( * ) Notice: Subject to any disclaimer, the term of this patent is extended or adjusted under 35 U.S.C. 154(b) by 15 days.

(21) Appl. No.: 11/059,171

(22) Filed: Feb. 16, 2005

(65) Prior Publication Data

US 2005/0206239 A1 Sep. 22, 2005

Related U.S. Application Data

(60) Provisional application No. 60/568,811, filed on May 6, 2004, provisional application No. 60/559,989, filed on Apr. 5, 2004, provisional application No. 60/550,133, filed on Mar. 4, 2004.

(51) Int. Cl.
*H05K 7/14* (2006.01)

(52) U.S. Cl. ...................................................... 307/149

(58) Field of Classification Search ................. 307/149
See application file for complete search history.

(56) References Cited

U.S. PATENT DOCUMENTS

| | | | | |
|---|---|---|---|---|
| 6,374,591 | B1 | 4/2002 | Johnson et al. | |
| 6,973,948 | B1 * | 12/2005 | Pollack et al. | 141/387 |
| 2003/0226373 | A1 | 12/2003 | Prible et al. | |

FOREIGN PATENT DOCUMENTS

GB 2 337 366 11/1999

OTHER PUBLICATIONS

Peter, J. Hill, Bahadir Inozu, Ting Wang, and John J. Bergeron; Offshore Technology Conference OTC 14289; Offshore Power Generation Using Natural Gas From Remote Deepwater Developments; May 2002; p. 1-7.

Jean-Gerard P. Napoleoni; Offshore Europe; Firms Study Power Plant Idea; Oct. 5, 1980; p. 102, 105-106.

* cited by examiner

*Primary Examiner*—Robert L. Deberadinis
(74) *Attorney, Agent, or Firm*—Leon D. Rosen

(57) ABSTRACT

A system for using natural gas to safely provide large amounts (at least 30 megawatts) of electricity to consumers. The system includes a floating generating vessel (110) that lies offshore and carries one or more turbine-generator sets (114, 116) that use natural gas as fuel and whose electricity output is delivered though a power line (138) that extends at least partially in the sea to a consumer. One consumer is a process vessel (112) that processes natural gas and that has transfer facilities (68) that transfer liquified gas to or from a tanker (106) that holds over 10,000 tons of liquified gas. Some of the gas is transferred from the process vessel through a conduit (136) in the sea to the generating vessel (110) to provide fuel. Another consumer is an onshore facility (52). The generating and process vessels (110, 112) are widely separated (e.g. at least 0.2 kilometer) to protect personnel in the event of a gas explosion or fire. The separate generating and process vessels enable rapid acquisition of the vessels, which is especially useful to quickly supply large quantities of electricity in newly developed areas.

12 Claims, 2 Drawing Sheets

FLOATING POWER GENERATION SYSTEM

CROSS-REFERENCE

Applicant claims priority from U.S. provisional applications 60/568,811 filed May 6, 2004, 60/559,989 filed Apr. 5, 2004, and 60/550,133 filed Mar. 4, 2004.

BACKGROUND OF THE INVENTION

The storage of large quantities of natural gas carries the danger of an explosion or great fire. Large quantities of natural gas are becoming available by transporting it as liquified gas (by cooling to liquify or hydrate it) by tankers each holding over 10,000 tons of gas, from distant hydrocarbon fields that produce large quantities of natural gas. Such gas (primarily gas with three or four carbon atoms per molecule) may be liquified by a production and processing vessel lying over an offshore hydrocarbon reservoir, and later heated to regas it as its destination. For both liquefaction by cooling and regas by heating, large amounts of electricity are used. It would be desirable if such system for processing gas and generating electricity could be readily acquired. It also would be desirable if a maximum portion of personnel were safeguarded from explosions or large gas fires.

SUMMARY OF THE INVENTION

In accordance with one embodiment of the invention, applicant provides an offshore system for flowing electricity to a power consumer such as processing equipment that liquefies natural gas so it can be sent by tanker to a distant location, or that regases liquified natural gas that is received from a tanker. The system includes an offshore process vessel that processes gas and that transfers liquified gas to or from a tanker, and also includes a separate generating vessel that contains an electricity generating set. The use of two vessels enables smaller vessels to be used, which enables more rapid acquisition of the vessels. The generating vessel is far (at least 0.2 km) from the process vessel to safeguard personnel on the vessels from an explosion or fire at the process vessel or tanker or at the generating vessel.

Electricity also can be carried from a generating vessel to an onshore distribution facility. In that case, the generating vessel lies a sufficient distance from shore to avoid on shore damage from any gas fire or explosion on the generating or process vessels, but close enough to enable efficient passage of electricity from the vessel to the onshore distribution facility though a sea floor power cable. The distance is preferably sufficient so the vessels are not clearly visible from shore.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
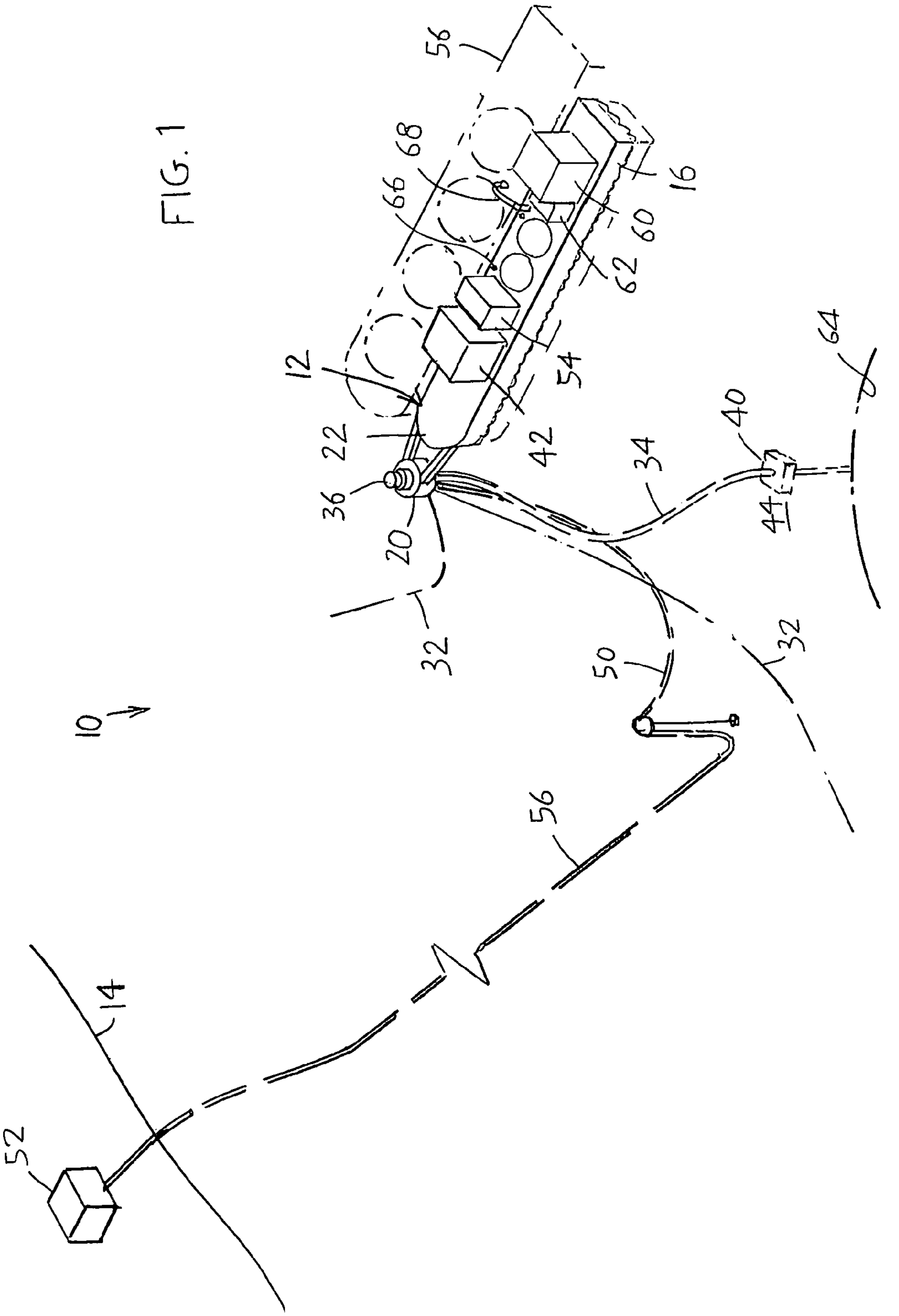
FIG. 1 is an isometric view of a system for using natural gas to generate electricity, with the gas obtained from liquified natural gas brought to the vicinity by a tanker which is shown in phantom lines.

FIG. 1 illustrates a system 10 for generating large amounts of electricity (at least 30 megawatts), using natural gas as a fuel, which includes a vessel 12 that lies offshore (usually less than about 200 kilometers from shore 14). The vessel, such as a barge, has a hull 16 that supports a turret 20 at its bow end 22. The turret is moored by a mooring system such as catenary lines 32 that extend to the sea floor and along it. Risers 34 extend from a swivel 36 on the turret to a sea floor platform 40. The turret allows the vessel to weathervane, that is, to face in different directions with changing winds and waves, while the catenary lines allow the vessel to drift but only a limited distance, from a location 44 over the sea floor platform. Other mooring systems that can be used instead, including spread mooring.

The vessel carries an electricity generating unit 42 that uses gas as a fuel to generate electricity. A preferred unit is a turbine-generator set wherein the turbine is powered by natural gas and the turbine spins a rotor of an electric generator. Such turbine-generator set is of light weight in proportion to the electrical power it generates, and the use of gas results in the generation of minimum polluting gases. The system includes a power cable 50 that extends from the vessel and that has a major portion 56 extending along the sea floor to an onshore distribution facility 52. The facility distributes electricity to consumers such as residential, factory and office structures. The vessel is shown also carrying a second electricity generating unit 54.

In the system of FIG. 1, natural gas that is the fuel, is obtained from a tanker 56 that gathers natural gas from a distant reservoir, liquefies it (by cooling below 0° C., and usually below −40° C. for efficient transport, and unloads the gas to the vessel 12. The vessel has a regas unit 60 that heats the gas to make it liquid, and a pressurizing unit 62 that pumps the gas. Although tanks are usually provided in the vessel to store gas, either before it is liquified or afterwards, most of the gas is preferably stored in an underground cavern 64 such as an undersea cavern that has been formed out of a salt deposit. A gas-loaded tanker may, for example, come to the vessel in a once-a-week cycle and stay for only a day or two to offload, so gas must be stored during the rest of the week. The vessel has tanker mooring facilities such as capstans 66 for holding to lines that moor the tanker alongside the vessel 14 or that moor the tanker while it lies behind the vessel. In both cases, if the vessel weathervanes then the vessel 14 and tanker 56 weathervane together. The vessel also has transfer facilities 68 that transfer liquified gas between the tanker and vessel.

A vessel that is moored offshore and that carries an electricity generating unit can serve a need for large amounts of electricity in an acceptable manner. Crude oil is more easily transported than gas, and has more uses than gas, so crude oil transported by tanker is expensive. Natural gas that is transported from distant locations by tanker, is difficult to unload on shore near developed areas because people are concerned about a possible fire or explosion of the large quantities of natural gas at a large unloading facility at the shore. If the unloading facility can be placed far from shore, which is at least about one kilometer and usually more, so people and property are protected from any fire or explosion, then the use of natural gas there is more acceptable. The vessel may be located at least three kilometers from shore so it can be hardly seen from shore, and is preferably no more than 200 km from shore to minimize electric power cable cost and electricity loss. Another advantage of generating electricity by a gas-fueled generator set on a far offshore vessel, is that the vessel may be produced on speculation or be available when no longer used at a distant location. Such a vessel with the heavy generator set and other large equipment already on board, can be moved rapidly and at low cost to a desired offshore location near where electricity in large amounts is required. In addition, the vessel sometimes can be obtained by using an existing hull, especially one used to produce or transport hydrocarbons, and converting it.

The first generating unit 42 provides a considerable amount of power such as 30 to 500 megawatts. The second generating unit 54 is usually smaller, and can be added to produce more electricity if sufficient gas is available and extra electricity is needed, and can be removed and transferred to another vessel.

Figure 2:
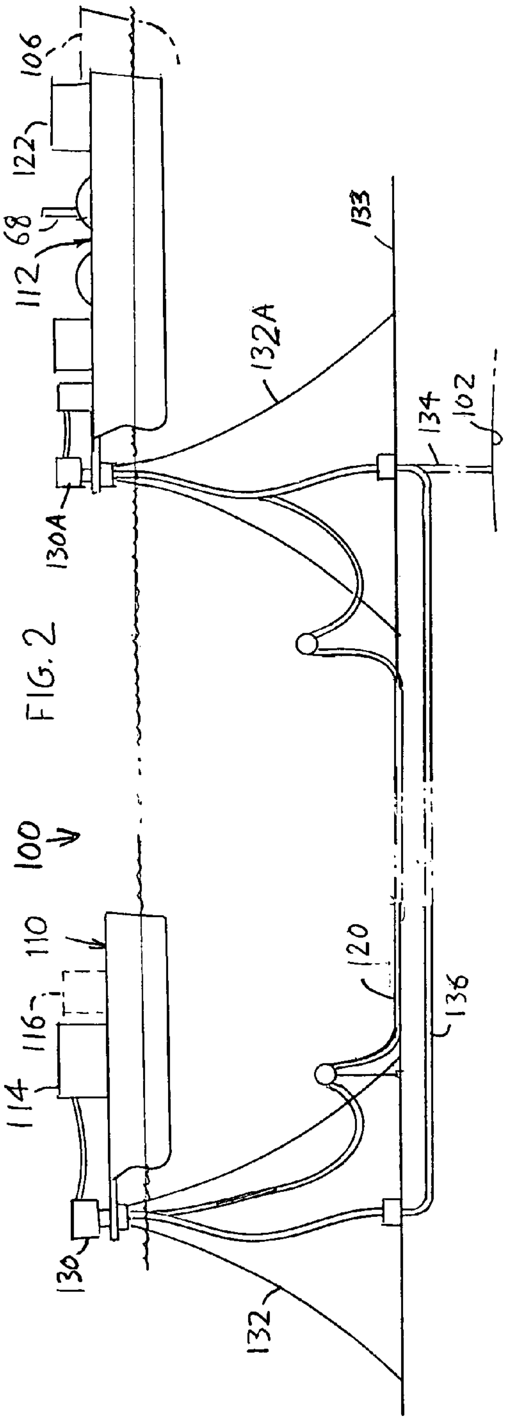
FIG. 2 is a side elevation view of a system of another embodiment of the invention wherein the system includes a process vessel that produces gas from a reservoir and liquefies it for tanker transport, and a separate and spaced generating vessel that generates electricity for the process vessel.

FIG. 2 illustrates a system 100 where liquified gas is produced from a local hydrocarbon reservoir, or well, 102 by equipment on a production and processing vessel 112. The processing, or process vessel cools the natural gas (to −40° C. or lower) to liquify it, and periodically (e.g. one or two days out of every seven) loads it onto a tanker 106. Applicant uses two vessels 110, 112. A generating or generator vessel 110 carries an electricity generating unit 114 and possibly an additional but smaller one 116, and connects to a power line 120 that extends in the sea to the process vessel 112. The process vessel 112 carries a gas liquification unit 122 and tanks for storing gas (in cold liquid form), in addition to mooring equipment for mooring to the tanker 106. The liquified gas is offloaded to the tanker that carries it to a distant gas-consuming location, such as to the system shown in FIG. 1. Preferably, the process vessel 112 can store at least 10,000 tons of liquified gas to store at least one load of LNG for the tanker 102. Liquified gas cannot be stored in a cavern. In FIG. 2, the generator vessel 110 is moored by a turret 130 and catenary lines 132, and the process vessel 112 is moored in a similar way by a turret 130A and lines 132A, and with the offloading tanker lying alongside the process vessel and moored tightly to it. The quiescent location of the vessel bow (its location in a calm sea) is the vessel location. Since both vessels drift under the same forces, the distance between their bows is usually about constant.

In the system of FIG. 2, gas from the well or reservoir 102 that lies below the sea floor 133 is provided to both vessels through seafloor pipes 134, 136 (pipes lying at least partially on or in the sea floor). Electrical power from generator vessel 110, which uses gas for fuel, is supplied through the electric cable 120 that extends partially along the sea floor to the power consuming liquification barge 112, or process vessel. Such electrical power is needed to liquify the gas from the well 102. Additional electric power can be supplied to other facilities on shore or offshore.

The advantage of the arrangement of FIG. 2 is that two smaller vessels 110 and 112 are used instead of one large one. It takes longer to find an open slot in a shipyard to build a large vessel than it does to build a small one. Also, the vessel 110 is useful to generate electricity where gas is available from local fields as in FIG. 2 (and is not to be liquified and transported elsewhere), or where gas is available by offloading it from a tanker.

The two vessels 110, 112 are preferably spaced far apart, such as at least 0.2 kilometer and preferably at least 0.5 km apart. This provides safety to personnel on one vessel in the event of an explosion or great fire at the other vessel 112. Of course, the greatest explosion and fire would occur at the process vessel 112. Thus, applicant prefers to use two (or more) separate vessels. One vessel such as 112 is used to process gas as to liquify or gasify it. Such vessel for processing gas contains large quantities (e.g. over 10,000 tons) of hydrocarbon at the sea surface and in its vicinity (in the vessel 112 and/or the adjacent tanker 106) leading to the danger of an explosion or great fire. The other vessel 110 is used to generate electricity and uses gas as fuel, but may contain substantial gas (e.g. over 200 tons). The two or more vessels help isolate a maximum number of personnel from equipment on the other vessel and enable each vessel to be provided at the site with less delay because it can be built in moderate size shipyards or built by converting an existing vessel.

Figure 3:
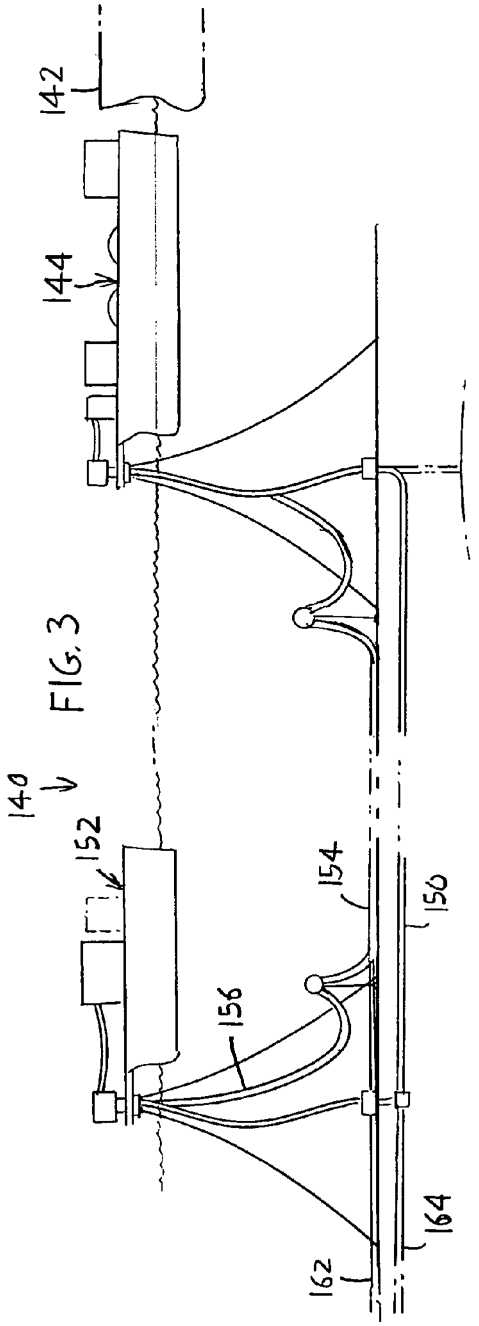
FIG. 3 is a side elevation view of a system of another embodiment of the invention which includes a process vessel for offloading, regasing and pressurizing liquid gas received from a tanker, and a generating vessel for generating electricity for the process vessel and for delivery to an onshore consumer.

FIG. 3 illustrates a system 140 wherein liquified gas (e.g. at −40° C. or lower) is brought by a tanker 142 to a process vessel 144. Processing equipment on vessel 144 regases (heats) the liquified gas to above about 0° C. (to avoid icing) and pumps it. Considerable electricity is used in the heating and pumping processes, even though sea water is used to provide heat. Some of the gas is delivered through a seafloor pipe 150 to a generating vessel 152 that generates electricity. A considerable amount (at least 1 MW) of electricity is delivered by the generating vessel along power cable portions 154, 156 to the process vessel to supply its electricity needs.

If it is desired to deliver large amounts of electricity to another consumer such as one on shore, then the generating vessel carries large electric generator sets and delivers at lot (e.g. 30 MW to 500 MW) of electricity through a large seafloor cable 162. If it is desired to deliver large amounts of natural gas to an onshore facility, then a lot is delivered through a sea floor pipeline 164.

Thus, the invention provides a vessel that uses gas to produce large amounts of electricity. The electricity is delivered to one or more offshore consumers such as an offshore gas processing facility (vessel or platform) that liquefies gas or that gasifies liquified gas, and/or to an onshore distribution facility. An offshore gas processing facility that sometimes contains over 10,000 tons of gas, is separated (e.g. over 0.2 kilometer and preferably at least one kilometer) from a separate electricity generating vessel and from any on-shore location where people may be present. The use of a vessel that carries an electricity generating unit and other equipment for using gas as a fuel, facilitates rapid setup of the electricity-generating facility and reuse at other locations. The invention is especially useful to safely provide large amounts of electricity to remote and fast-developing regions (e.g. certain countries in Africa) without requiring extensive onshore infrastructure other than an electricity distribution network.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A system for safely using natural gas to generate electricity for one or more electricity consumers, comprising:

a floating offshore structure that lies in a sea at a distance of between 0.2 kilometer and 200 kilometers from said power consumer;

said floating structure having an electricity generating unit that uses gaseous hydrocarbons as a fuel and that generates electricity;

an electricity power line that extends from said floating structure and under water to said consumer, to isolate persons and property from a disaster at the floating structure while providing an easily set up facility to generate electricity.

2. The system described in claim 1 wherein:

said consumer is located on shore, and said floating offshore structure includes transfer facilities constructed to transfer natural gas between the floating structure and a tanker that holds over 10,000 tons of natural gas;

said floating structure lies at least one kilometer from the shore.

3. The system described in claim 1 including:

a gas processing vessel that includes a process hull that is moored to lie at a first location in the sea, hydrocarbon processing equipment on said process hull, and transfer facilities for transferring natural gas between said first hull and a tanker;

said floating offshore structure comprises a generator vessel that includes a generator hull and an electricity generator unit thereon that generates electricity;

said process vessel comprises said consumer; and including a gas conduit that extends between said gas process vessel and said generator vessel and that carries gas to said generator vessel.

4. The system described in claim 3 including an underground cavern that stores natural gas, and including:

at least one conduit extending between said floating structure and said cavern.

5. A system for safely using natural gas to generate electricity for an electricity consumer comprising:

an offshore gas process vessel that includes a process hull that is moored at a first location to the sea floor, hydrocarbon gas processing equipment on said process hull, and transfer facilities constructed to transfer liquified hydrocarbon gas between the process hull and a tanker that carries at least 10,000 tons of liquified gas;

a generator vessel that includes a generator hull that is moored at a second location to the sea floor, and an electricity generator unit that uses natural gas as fuel to generate electric power;

an electric cable that carries electricity from said generator unit to said gas processing equipment on said gas process vessel;

said generator vessel lying at least 0.2 kilometer from said process vessel, to provide safety to personnel.

6. The system described in claim 5 wherein:

said hydrocarbon processing equipment includes regasing equipment that heats liquified hydrocarbon gas, and said transfer facilities are constructed to transfer liquified hydrocarbon gas from a tanker to said processing equipment; and including a gas conduit that extends from said gas processing vessel to said generator vessel to supply gas for fuel thereto.

7. The system described in claim 5 wherein:

said hydrocarbon processing equipment includes refrigerating equipment that cools hydrocarbon gas to a temperature at which it is liquid, and said process vessel is connected to an undersea well that produces gaseous hydrocarbons; and including a conduit that carries gaseous hydrocarbons produced from said well to said generator vessel to supply said natural gas thereto.

8. A method for using gaseous hydrocarbons as a fuel to provide electricity to one or more consumers, comprising:

anchoring to a sea floor, a first floating structure that lies in a sea and that carries a gas fueled electricity generating unit;

supplying gaseous hydrocarbons to said first floating structure and operating said generating unit to use said gaseous hydrocarbons as a fuel to generate electricity;

establishing an underwater electricity-carrying power line in extension between said first floating structure and a first of said consumers, and passing electricity from said floating structure and along said power line to said first consumer.

9. The method described in claim 8 including:

anchoring to said sea floor, a second floating structure which carries processing equipment that processes liquified gas, and which carries transfer equipment that transfers liquified gas between the second floating structure and a tanker;

mooring a tanker that carries more than 10,000 tons of cold hydrocarbons at a temperature below −40° C., at a location adjacent to said second floating structure, and transferring cold liquified gas between said tanker and said second floating structure, and supplying electricity from said first floating structure to said second one to thereby facilitate acquisition of said first and second structures.

10. The method described in claim 9 wherein:

said steps of anchoring said first and second floating structures includes anchoring them at least 0.2 kilometer apart, to thereby protect at least personnel on said first floating structure.

11. A method for using gaseous hydrocarbons as a fuel to provide electricity to an onshore distribution facility for delivery to electricity consumers such as factories, offices, and residences, in a manner that isolates the consumer from any dangers arising in the handling of such gaseous hydrocarbons, comprising:

anchoring to a sea floor, a first floating structure that lies in a sea and that carries a gas-fueled electricity generating unit;

establishing an underwater electricity-carrying power line in extension between said first floating structure and said onshore distribution facility;

supplying said gaseous hydrocarbons to said first floating structure;

flowing said gaseous hydrocarbons to said generating unit to generate electricity, and passing said generated electricity along said power line to said onshore distribution facility.

12. The method described in claim 11 wherein:

said method of supplying said gaseous hydrocarbons to said first floating structure includes mooring a tanker that carries cold liquified hydrocarbons, adjacent to second floating structure, transferring said liquified hydrocarbons between the tanker and the second floating structure, and supplying gas to said generating unit from a sea floor conduit that extends from said second floating structure to said first floating structure; and carrying electricity from said first floating structure to said second floating structure through a power cable that extends in the sea.

* * * * *